March 15, 1966 A. T. KLINGBERG 3,241,084

SYSTEM TO EXTEND THE CONTROL RANGE OF PHASE LOCKED OSCILLATORS

Filed Oct. 29, 1962

INVENTOR.
Arthur T. Klingberg
BY Mueller & Aichele
Attys.

United States Patent Office 3,241,084
Patented Mar. 15, 1966

3,241,084

SYSTEM TO EXTEND THE CONTROL RANGE OF PHASE LOCKED OSCILLATORS

Arthur T. Klingberg, Elk Grove Village, Ill., assignor to Motorola, Inc., Chicago, Ill., a corporation of Illinois
Filed Oct. 29, 1962, Ser. No. 233,746
7 Claims. (Cl. 331—111)

This invention relates to frequency control systems and more particularly to an improved automatic phase and frequency control system for extending the capture range of phase locked oscillators.

There are many present day applications where it is desirable to synchronize the phase and frequency of a received signal with locally produced oscillations. A particularly useful application is in the reception of suppressed carrier single sideband signals, where for proper demodulation of the sideband signal it is necessary to reinsert a signal generated at the receiver at the same frequency and phase as the original carrier. In such systems synchronization between the received residual carrier and the reinsertion signal is possible by applying a control signal produced in response to phase differences between these two signals to a variable reactance associated with the local oscillator.

However, where precise frequency control is desired the range of pull-in or capture provided by the control signal is correspondingly limited. For this reason it is generally necessary to utilize two control signals, one having a relatively large pull-in range to capture the local oscillator, and the other providing for precise frequency control once capture of the local oscillator has been achieved. To obtain precise frequency control it is common to use a phase detector to provide an error signal to lock the local oscillator into synchronization in response to phase and frequency differences between the locally generated signal and the incoming signal. Known systems used in conjunction with the phase detector to extend its pull-in range are either limited in range, require complex and unstable circuitry such as D.C. amplifiers, or are specifically adapted for a single frequency and require mechanically ganged tuning circuits for wide band tuning applications.

It is therefore an object of the present invention to provide an improved automatic phase control system with extended capture range for phase locked oscillators.

A further object is to provide an automatic phase control system for controlling phase locked oscillators, which system has an extended seize range for wide band tuning range applications.

Another object is the provision of a system for providing a wide range error signal to the reactance element of a variable frequency oscillator to bring the frequency of the oscillator within capture range of a phase sensitive control circuit.

A feature of the present invention is the provision of a frequency discriminator to provide a control voltage in response to an error signal about a fixed frequency reference signal to supplement the control provided by a phase detector in an automatic phase control system to extend the seize range of the system.

A further feature is the provision of a means for producing an error signal which is indicative of frequency changes with respect to a fixed frequency reference signal and means responsive to the error signal to control the reactance circuit of an oscillator to bring the oscillator within the capture range of a phase detector of an automatic phase control loop.

A still further feature is the provision of an automatic phase control system having a wide range pull-in circuit including first and second mixing means to produce a signal variable in frequency about a fixed reference frequency in response to the frequency difference between a variable frequency reference signal and an oscillator output signal. A discriminator having the same center frequency as the fixed reference frequency produces a direct current control voltage in response to frequency variations to bring the output frequency of the oscillator within the pull-in range of the phase detector of an automatic phase control loop so that the oscillator output frequency may be phase locked with the variable frequency reference signal.

Further objects, features and other attending advantages will be apparent upon consideration of the following description when taken in conjunction with the accompanying drawings, in which.

In a preferred form of the invention precise control of a variable frequency oscillator is obtained by a first error signal obtained in response to the difference in phase and frequency between a received signal and a locally generated signal. By way of example, although not limiting, the received signal may be the residual or pilot carrier of a suppressed carrier single sideband transmission, while the local signal is generated to provide carrier reinsertion for the sideband demodulation. The first error signal is fed to a phase detector to provide a control signal of proper phase and magnitude to lock the carrier reinsertion signal with the pilot carrier.

A second error signal is provided by first mixing the locally generated signal with a fixed frequency reference signal to provide a sum or difference frequency signal, and by subsequently mixing the sum or difference frequency signal with the received signal. The error signal provided by this second mixing operation is a signal having a frequency equivalent to the combination of the fixed reference frequency and the frequency difference between the received signal and the locally generated signal. This second error signal is filtered and applied to a frequency discriminator having a center frequency the same as the fixed reference frequency to provide a direct current output signal which corresponds in phase and magnitude to the difference between the frequency of the locally generated signal and the received signal. When coupled by a low pass filter to the reactance circuit of the oscillator, this D.C. control signal adjusts the oscillator frequency to bring it within the capture range of the precise frequency control provided by the phase detector.

Figure 1:
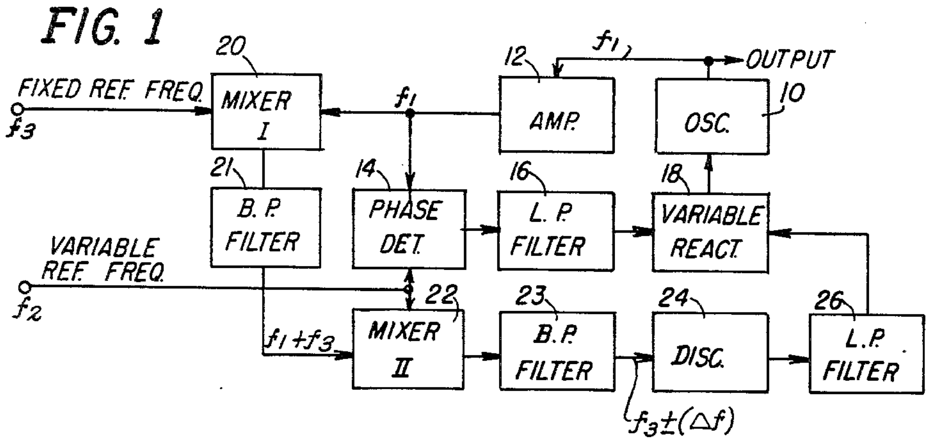
FIG. 1 is a block diagram of the system of the present invention.

Referring now to FIG. 1 it may be seen that the output frequency of oscillator 10 is phase locked with a variable frequency reference signal by a conventional automatic phase control loop. It is to be understood that throughout the specification and in the claims the variable frequency reference signal is that received signal with which it is desired to phase lock a locally generated signal. A portion of the output of oscillator 10 is coupled through amplifier 12 to phase detector 14. Phase detector 14 also receives a variable frequency reference signal such as the pilot carrier of a single sideband transmission. The output of phase detector 14 is coupled through low pass filter 16 to variable reactance circuit 18. Typically variable reactance circuit 18 may be a reactance tube coupled as a frequency determining element of oscillator 10 to control the frequency of the oscillator in a manner well known in the art. Alternately variable reactance 18 may be a voltage variable capacitance element or a biased semiconductor diode functioning as a tuning capacitance. The output of phase detector 14 is responsive both in phase and magnitude to the difference between the output of oscillator 10 and the variable frequency reference signal and accordingly a control loop is provided to phase lock these two signals.

To extend the capture range of the system to bring the frequency of the output of oscillator 10 within control of this control loop, a portion of the output of oscillator 10 is further coupled from amplifier 12 to first mixer 20. A fixed frequency reference signal is also coupled to first mixer 20. This fixed reference frequency is preferably lower than the frequency of oscillator 10 and is selected to provide a desired center frequency for a frequency discriminator as hereinafter described. The sum or difference output signal of mixer 20 is coupled by pass band filter 21 to second mixer 22. Mixer 22 further receives a portion of the same variable frequency reference signal that is supplied to phase detector 14. The output of second mixer 22 includes a signal component having a frequency that is the sum or difference between the fixed frequency reference signal and the difference between the output of oscillator 10 and the variable frequency reference signal. Therefore, this signal component has a center frequency that is the same as the fixed reference frequency and varies in frequency about this center frequency in response to the frequency difference between the output of oscillator 10 and the variable reference frequency. This signal component is selected by pass band filter 23 and coupled to discriminator 24. As previously mentioned, the center frequency of discriminator 24 is selected to coincide with the fixed reference frequency supplied to mixer 20. The output of discriminator 24 is a D.C. voltage which corresponds in phase and magnitude to any frequency difference which exists between oscillator 10 and the variable reference frequency.

The output of frequency discriminator 24 is coupled by low pass filter 26 to variable reactance 18. This provides a control voltage in response to frequency differences which exists between the output of the oscillator and the variable reference frequency, causing the frequency of oscillator 10 to change until it comes within the pull-in range of the automatic phase control loop including phase detector 14 and variable reactance 18. To prevent hunting of the system the time constant of low pass filter 26 may be made long with respect to the time constant of low pass filter 16 so that variable reactance 18 responds relatively slowly to the output of discriminator 24 but responds rapidly to the output of phase detector 14. Alternately variable reactance 18 may include two individual elements, one each for phase detector 14 and discriminator 24. Once within the pull-in range of phase detector 14 of the automatic phase control loop the output of oscillator 10 is quickly and precisely phase locked with the variable reference frequency.

If the output frequency of oscillator 10 is $f_1$ and the variable reference frequency is $f_2$, then the frequency difference supplied to phase detector 14 to provide a control voltage for variable reactance 18 is $\Delta f$. When oscillator frequency $f_1$ and fixed reference frequency $f_3$ are coupled to first mixer 20, an output frequency of $f_1+f_3$ is selected by pass band filter 21. By further mixing the frequency $f_1+f_3$ with variable reference frequency $f_2$ in second mixer 22, the sum and difference of frequency $f_2$ also appears in the output of mixer 22. By selecting the difference frequency by pass band filter 23, the signal fed to discriminator 24 is $f_3+f_1-f_2$. As previously mentioned, $f_1-f_2$, or $\Delta f$, is equal to the frequency difference between the output of oscillator 10 and the variable reference frequency $f_2$. Discriminator 24 has a center frequency of $f_3$ so that when there is no frequency difference between $f_1$ and $f_2$, discriminator 24 provides no output. However, when $\Delta f$ appears at the output of pass band filter 23, either above or below frequency $f_3$, an output is provided by discriminator 24 corresponding in both phase and magnitude to the variation of $\Delta f$ about frequency $f_3$.

This output, when coupled to variable reactance 18, adjusts the output frequency of oscillator 10 to reduce the value of $\Delta f$. When $\Delta f$ is sufficiently small to be within the capture range of phase detector 14, the automatic phase control loop takes over to provide the necessary adjustment in both phase and magnitude of oscillator 10 to insure that its output remains phase locked with variable reference frequency $f_2$.

Figure 2:
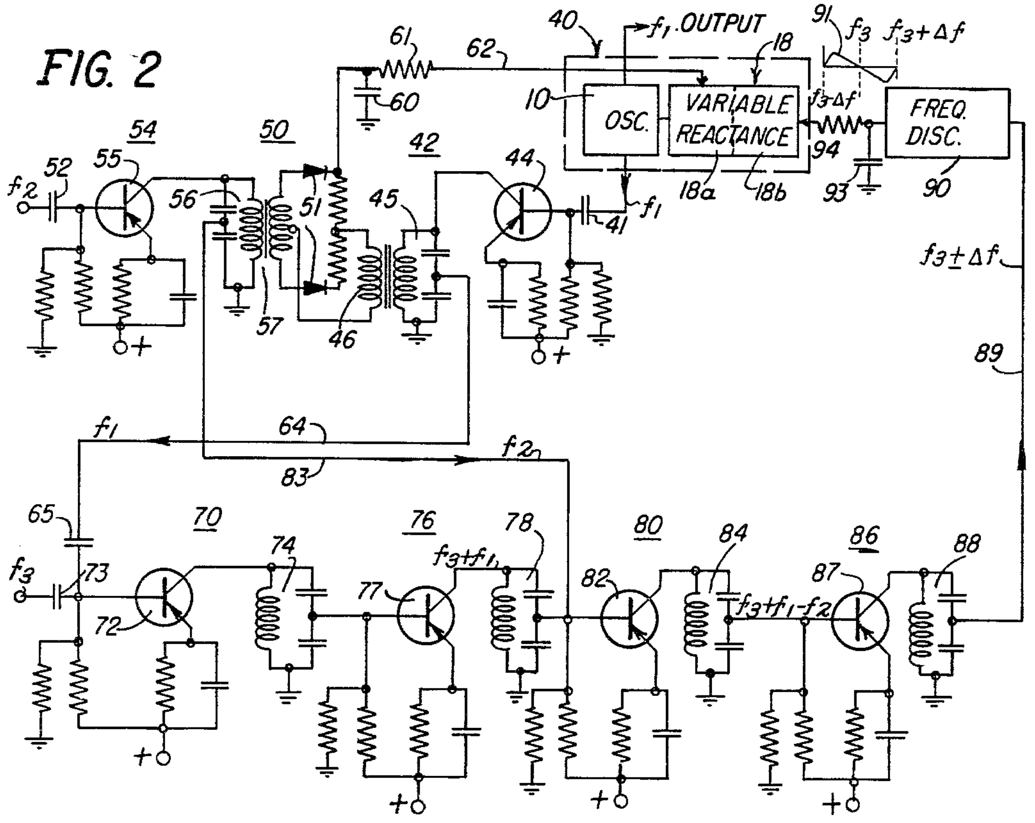
FIG. 2 is a diagram partially in schematic and partially in block form of a circuit embodiment for use in conjunction with the system of FIG. 1.

A transistorized circuit embodiment of the invention is shown in FIG. 2. Although the circuit therein shown illustrates a particularly useful embodiment for practicing the invention, it is to be understood that individual circuit elements illustrated in the system of FIG. 1 are conventional in the art and other known circuits than those specifically shown in FIG. 2 may also be used in the system. As is the usual practice, oscillator 10 and variable reactance 18 are combined to provide variable frequency oscillator unit 40. Frequency control of the oscillator unit over a given range is provided by incorporating a voltage variable reactance element into the frequency determining portion of the oscillator circuit. As previously mentioned, such elements may be a reactance tube, a voltage variable capacitance or inductance, or a reverse biased semiconductor diode of the type known as a varactor diode. Reactance element 18 may be a single element with control voltages supplied to it through filter networks having relatively different time constants, or may include two individual elements 18*a* and 18*b* responsive to the phase-lock control voltage and the extended range capture voltage, respectively.

A portion of the output of oscillator unit 40 is coupled by capacitor 41 to tuned amplifier stage 42. This stage includes a base input transistor 44 having a tuned circuit 45 coupled between its output collector electrode and ground reference potential. The output of tuned amplifier stage 42 is coupled by winding 46 to phase detector 50, which functions to provide the error signal of the automatic phase control loop.

Phase detector 50 is of the type employing a pair of balanced diodes 51, and functions in a manner well-known in the art. It is obvious, however, that any device capable of comparing two signals and developing an error signal when the frequency or phase do not agree may be used to provide the error signal in the system of the invention. A variable frequency reference signal is coupled by capacitor 52 to the base input electrode of transistor 55 in tuned amplifier stage 54. When the system of the invention is utilized in a single sideband communications receiver, this signal may be the residual or pilot carrier as derived from a convenient point in the intermediate frequency stages of the receiver. The output of tuned amplifier stage 54, developed across tuned circuit 56, is coupled by transformer 57 to provide the second input for phase detector 50. Accordingly, a control voltage is developed across the filter network including capacitor 60 and resistor 61 whenever there is a difference in phase or frequency between the two signals coupled to phase detector 50. This voltage is fed on leads 62 to the variable reactance portion 18 of oscillator unit 40.

Tuned circuits 45 and 56 for amplifier stages 42 and 54 respectively are relatively wide band to encompass the capture range of the frequency control loop. Because of the wide capture range provided in the manner herein described, precise tuning is not necessary. Band switching is readily accomplished my mechanically ganging the tuning elements of tuned circuits 54 and 56 so that the frequency of the system may be changed in discrete steps. Resistor 61 and capacitor 60 are selected to provide a sufficiently short time constant to allow phase detector 50 to retain control over the system once the frequency of oscillator unit 40 has been brought into its capture range.

A portion of the output of amplifier stage 42 is further coupled by lead 64 and capacitor 65 to the base input electrode of transistor 72 of first mixer 70. Capacitor 73 also couples a fixed frequency reference signal to the base input electrode of mixer transistor 72. This signal is supplied from a stable oscillator source such as a crystal controlled oscillator. Its frequency is chosen to be lower than the frequency of oscillator unit 40. Preferably the difference between the frequency of oscillator unit 40 and the variable reference frequency is an appreciable portion of the fixed reference frequency. Thus, the fixed reference frequency provides a center frequency for the discriminator of the system, and differences between the oscillator unit frequency and the variable reference frequency provide an output control voltage which varies over the linear portion of the characteristic "S" curve of the discriminator output.

Tuned circuit 74 is tuned to select the signal component representing sum of the fixed reference frequency and the oscillator frequency. This sum signal is amplified and filtered by tuned amplifier stage 76, including transistor 77 and tuned output network 78, and is coupled to the base input electrode of transistor 82 of second mixer stage 80. A portion of the variable reference frequency output of stage 54 is coupled on lead 83 as a second input to the base electrode of mixer transistor 82. Tuned circuit 84 selects the difference frequency of these two signals supplied to the input base electrode of mixer transistor 82. As previously mentioned, the result of this second mixing operation includes a signal component representing the sum of the oscillator frequency and the fixed reference frequency, and the difference of the variable reference frequency. It is this component that is selected by tuned circuit 84.

The selected output of second mixer stage 80 is amplified and filtered by amplifier stage 86, including transistor 87 and tuned circuit 88. The output of tuned circuit 88 is coupled on lead 89 to discriminator 90. The center frequency of tuned circuits 74, 78, 84 and 88, as well as the center frequency of discriminator 90, are selected to be the same as the fixed reference frequency. These tuned circuits have a pass band sufficient to pass the variations between the oscillator frequency and the variable reference frequency which can be captured by the output of discriminator 90. By way of illustration, for use in a typical single sideband communications receiver operating in the VHF region, oscillator unit 40 provides a reinsertion frequency to be phase locked with a residual carrier adjustable over 8 mc. band in discrete 600 kc. steps. The fixed reference frequency and the discriminator center frequency may be selected to be 3 megacycles, with the bandwidth of the tuned circuit and the frequency deviation of discriminator 90 selected to provide a ±300 kc. capture range.

Frequency discriminator 90 is of the type conventional in the art to provide a characteristic "S" curve output as shown by waveform 91. Variations in frequency between the output of oscillator unit 40 and the variable frequency reference signal, or $\Delta f$, above and below the center frequency $f_3$ of the discriminator provides a direct current output voltage which is indicative both in phase and magnitude of such variations. This D.C. control voltage is applied to the filter network including capacitor 93 and resistor 94 to be coupled to variable reactance 18 of oscillator unit 40. With use of a single reactance element 18 the time constant of this filter network is preferably relatively long with respect to the time constant of the filter network coupling the output of phase detector 50 to variable reactance element 18 so that as the discriminator brings the oscillator frequency close to the capture range of phase detector 50, the phase detector takes over to hold the oscillator frequency in synchronization with the variable reference frequency. With use of individual reactance elements **18*a* and 18*b* it is not necessary to utilize filter networks of significantly different time constants. Operation is automatic so that for a wide variation between the oscillator frequency and the variable reference frequency the discriminator can pull oscillator unit 40** to within the capture range of the phase detector for precise frequency and phase control.

The invention provides therefore, an improved automatic frequency control system for extending the capture range of phase locked oscillators. The utility of the system is not limited to the particular application described above, and it may be used in transmitters and receivers of many types and in devices of a different character. It should be apparent to one skilled in the art that known equivalents for individual circuit components of the system may be substituted to provide the same overall operational characteristics. The system is automatic and stable in its operation and does not require precise mechanical tuning or adjustment for band switching. Once the center frequency of the discriminator and the pass band characteristics of the system have been established, the variable frequency reference signal to which the oscillator is to be phased locked can be readily tuned over a wide range employing known techniques. The wide capture range provided by the system enhances the utility and stability of phase locked variable frequency oscillators having a wide number of applications in the art.

I claim:

1. In an automatic frequency control system adapted to synchronize the phase and frequency of an oscillator output with a variable frequency reference signal, the combination including a phase detector, means coupling a signal representative of said oscillator output to said phase detector, means for coupling said variable frequency reference signal to said phase detector, circuit means coupling the output of said phase detector to said oscillator to control the phase and frequency thereof in response to phase and frequency differences between said oscillator output signal and said variable frequency reference signal, first mixer means, means coupling a signal representative of said oscillator output to said first mixer means, means for coupling a fixed frequency reference signal to said first mixer means, second mixer means, circuit means coupling a selected frequency range of the output signal of said first mixer means to said second mixer means, means for coupling said variable frequency reference signal to said second mixer means, frequency discriminator means, circuit means coupling a selected frequency range of the output of said second mixer means to said frequency discriminator means, and circuit means coupling the output of said discriminator means to said oscillator to vary its frequency, whereby the output of said discriminator means controls the oscillator frequency in response to frequency differences between said oscillator output signal and said variable frequency reference signal to thereby bring the oscillator frequency into the synchronization range of said phase detector.

2. In an automatic frequency control system adapted to synchronize the phase and frequency of an oscillator output with a variable frequency reference signal, the combination including a phase detector, means coupling a portion of said oscillator output signal to said phase detector, means for coupling said variable frequency reference signal to said phase detector, first low pass filter means coupling the output of said phase detector to said oscillator to control the phase and frequency thereof in response to frequency differences between said oscillator output signal and said variable frequency reference signal, a first mixer, means coupling a portion of said oscillator output signal to said first mixer, means for coupling a fixed frequency reference signal to said first mixer, a second mixer, circuit means coupling a selected frequency band of the output of said first mixer to said second mixer, means for coupling said variable frequency reference signal to said second mixer, a frequency discriminator, circuit means coupling a selected frequency band of the output of said second mixer to said frequency discriminator, and second low pass filter mean coupling the output of said discriminator to said oscillator, with said second low pass filter means having a long time constant relative to the time constant of said first low pass filter means, whereby the output of said discriminator maintains the frequency of the oscillator within the control range of said phase detector.

3. In an automatic frequency control system adapted to synchronize the phase and frequency of an oscillator with a first reference signal, the combination including a phase detector, means coupling a signal representative of said oscillator output to said phase detector, means for coupling said first reference signal to said phase detector, circuit means coupling the output of said phase detector to said oscillator to control the phase and frequency thereof in response to phase and frequency differences between said oscillator output and said first reference signal, first mixer means, means coupling a signal representative of said oscillator output to said first mixer means, means for coupling a second reference signal to said first mixer means, second mixer means, tuned circuit means coupling the sum frequency output signal of said first mixer means to said second mixer means, means for coupling said first reference signal to said second mixer means, frequency discriminator means, tuned circuit means coupling the difference frequency output signal of said second mixer means to said frequency discriminator means, and circuit means coupling the output of said frequency discriminator means to said oscillator to vary its frequency, whereby the output of said discriminator means controls the oscillator frequency in response to frequency differences between said oscillator output signal and said first reference signal to thereby bring the oscillator frequency into the synchronization range of said phase detector.

4. An automatically controlled oscillator system for providing signals phase locked with a variable frequency reference signal, said system including in combination, oscillator means, said oscillator means having variable reactance means operable to vary its phase and frequency in response to a control voltage, a phase detector, means coupling a signal representative of said oscillator output to said phase detector, means for coupling said variable frequency reference signal to said phase detector, circuit means coupling the output of said phase detector to said variable reactance means to synchronize the phase and frequency of said oscillator with said variable frequency reference signal, first mixer means, means coupling a signal representative of said oscillator output to said first mixer means, means for coupling a fixed frequency reference signal to said first mixer means, second mixer means, circuit means coupling a selected frequency band of the output signal of said first mixer means to said second mixer means, means for coupling said variable frequency reference signal to said second mixer means, frequency discriminator means, circuit means coupling a selected frequency band of the output signal of said second mixer means to said frequency discriminator means, and circuit means coupling the output of said frequency discriminator means to said variable reactance means, whereby the output of said frequency discriminator means controls the frequency of said oscillator in response to frequency difference between said oscillator output and said variable frequency reference signal to thereby maintain said oscillator within the synchronization range of said phase detector.

5. An automatically controlled oscillator system for providing signals locked in phase and frequency with a first reference signal, said system including in combination, oscillator means, said oscillator means having frequency determining means operable to vary its phase and frequency in response to a control voltage, a phase detector, means coupling a signal representative of said oscillator output to said phase detector, means for coupling said first reference signal to said phase detector, first low pass filter means coupling the output of said phase detector to said frequency determining means to synchronize the output of said oscillator with said first reference signal, a first mixer, means coupling a signal representative of said oscillator output to said first mixer, means for coupling a second reference signal to said first mixer, a second mixer, circuit means coupling a selected frequency band of the output of said first mixer to said second mixer, means for coupling said first reference signal to said second mixer, a frequency discriminator, circuit means coupling a selected frequency band of the output of said second mixer to said frequency discriminator, and second low pass filter means coupling the output of said frequency discriminator to said frequency determining means, with said second low pass filter means having a long time constant with respect to the time constant of said first low pass filter means, whereby the output of said frequency discriminator maintains the frequency of said oscillator within the control range of said phase detector.

6. An automatically controlled oscillator system for providing signals locked in phase and frequency with a variable frequency reference signal, said system including in combination, oscillator means, said oscillator means having a frequency determining variable reactance element operable to vary its phase and frequency in response to an error signal, a phase detector, means coupling said signal representative of said oscillator output to said phase detector, means for coupling said variable frequency reference signal to said phase detector, circuit means coupling the output of said phase detector to said reactance element to control the phase and frequency of the oscillator in response to an error signal provided by said phase detector, first mixer means, means coupling a signal representative of said oscillator output to said first mixer means, means for coupling a fixed frequency reference signal to said first mixer means, second mixer means, tuned circuit means coupling the sum frequency output signal of said first mixer means to said second mixer means, means for coupling said variable frequency reference signal to said second mixer means, frequency discriminator means, tuned circuit means coupling the difference frequency output signal of said second mixer means to said frequency discriminator means, and circuit means coupling the output of said frequency discriminator means to said variable reactance to vary the frequency of said oscillator, whereby the output of said discriminator means controls the frequency of said oscillator in response to frequency differences between said oscillator output signal and said variable frequency reference signal to thereby bring the oscillator frequency into the synchronization range of said phase detector.

7. An automatically controlled oscillator system for providing signals phase locked with a variable frequency reference signal, said system including in combination, oscillator means, said oscillator means having first and second variable reactance elements each operable to vary its phase and frequency in response to a control voltage, a phase detector, means coupling a signal representative of said oscillator output to said phase detector, means for coupling said variable frequency reference signal to said phase detector, circuit means coupling the output of said phase detector to said first variable reactance element to synchronize the phase and frequency of said oscillator with said variable frequency reference signal, first mixer means, means coupling a signal representative of said oscillator output to said first mixer means, means for coupling a fixed frequency reference signal to said first mixer means, second mixer means, circuit means coupling a selected frequency band of the output signal of said first mixer means to said second mixer means, means for coupling said variable frequency reference signal to said second mixer means, frequency discriminator means, circuit means coupling a selected frequency band of the output signal of said second mixer means to said frequency discriminator means, and circuit means coupling the output of said frequency discriminator means to said second variable reactance element, whereby the output of said frequency discriminator means controls the frequency of said oscillator in response to frequency difference between said oscillator output and said variable frequency reference signal to thereby maintain said oscillator within the synchronization range of said phase detector.

References Cited by the Examiner

UNITED STATES PATENTS

| | | | |
|---|---|---|---|
| 2,581,594 | 1/1952 | MacSorley | 331—11 |
| 2,610,297 | 9/1952 | Lead | 331—11 |

NATHAN KAUFMAN, *Acting Primary Examiner.*

JOHN KOMINSKI, *Examiner.*